United States Patent [19]

Blancha et al.

[11] Patent Number: 5,030,909
[45] Date of Patent: Jul. 9, 1991

[54] METHOD AND SYSTEM FOR CONTACTLESS TESTING OF ELECTRONIC ACTIVITY IN AN INTEGRATED CIRCUIT CHIP-TO-TEST AFTER PASSIVATION THEREOF

[75] Inventors: Armin U. Blancha, Horgen; Rolf Clauberg, Gattikon; Ernst H. Rothauser, Reichenburg; Hugo K. Seitz, Wollerau, all of Switzerland

[73] Assignee: International Business Machines Corporation, Armonk, N.Y.

[21] Appl. No.: 478,858

[22] Filed: Feb. 12, 1990

[30] Foreign Application Priority Data

Jun. 26, 1989 [EP] European Pat. Off. .......... 89111609.7

[51] Int. Cl.[5] ...................... G01R 15/12; G01R 31/22
[52] U.S. Cl. ............................ 324/158 R; 324/158 D
[58] Field of Search ............. 324/158 R, 158 D, 71.3, 324/501; 313/499, 501, 503; 250/487.1, 337, 310, 311; 356/389, 391, 425, 426

[56] References Cited

U.S. PATENT DOCUMENTS

| | | | |
|---|---|---|---|
| 4,296,372 | 10/1981 | Feuerbaum | 324/158 D |
| 4,350,893 | 9/1982 | Takahashi et al. | 250/337 |
| 4,644,264 | 2/1987 | Beha et al. | 324/158 D |
| 4,703,260 | 10/1987 | Beha et al. | 324/158 R |
| 4,706,018 | 11/1987 | Beha et al. | 324/158 R |
| 4,789,785 | 12/1988 | Yamazaki et al. | 250/487.1 |

Primary Examiner—Kenneth A. Wieder
Assistant Examiner—Vinh P. Nguyen
Attorney, Agent, or Firm—John J. Goodwin

[57] ABSTRACT

The chip-to-test (1) has a passivation layer and an overlayer at test points (4). The system comprises a vacuum chamber (8), means (2) for mounting and connecting the chip-to-test (1), a pulsed light source means (9) operable to scan the chip-to-test (1) for inducing photoelectron (15) emission therefrom, means (14) for exercising the circuits of the chip-to-test (1), means (18) for detecting the photoelectrons (15), having a detection threshold and delivering a sequence of signals representative of voltages at the currently scanned test point (4') or points as a function of the scanned point or scanning time, means (23) for flooding the chip-to-test (1) with electrons of energy lower than the detection threshold, means (21) for analyzing said sequence of signlas and means (22) for deriving therefrom a capacitive voltage contrast. The material of the overlayer has a work function lower than the photon energy and can be BeO, MgO, CaO, TiO2, more preferably SrO, Cs2O, BaO or a mixture thereof. This system facilitates testing of a chip-to-test whose passivation layer has a work function above the photon energy, and prevents charging-up of the passivation layer.

9 Claims, 2 Drawing Sheets

METHOD AND SYSTEM FOR CONTACTLESS TESTING OF ELECTRONIC ACTIVITY IN AN INTEGRATED CIRCUIT CHIP-TO-TEST AFTER PASSIVATION THEREOF

BACKGROUND OF THE INVENTION

1. Field of the Invention

This invention relates to contactless testing of electronic activity in an integrated circuit chip-to-test after passivation thereof, and more particularly relates to a static or dynamic testing procedure by which instantaneous operational voltage at one or more test points of the integrated circuit is interrogated by a pulsed light source means so as to induce photoemission for result interpretation by means of capacitive voltage contrast.

2. Description of the Prior Art

To analyze manufacturing failure, when faults have been detected in the final functional tests performed on integrated circuit chips having a passivation layer thereon, the usual procedure is to single out complete chips with a view to locating the source of the malfunction. The chips of interest here always have a passivation layer thereon, since passivation is performed prior to the final functional tests. Tests performed on internal nodes of these chips should then be conducted without removing the passivation layer, for the removal of the passivation layer may also remove or alter the malfunction of the chip or it may even introduce new errors which prohibit the detection of genuine errors. Since the voltage at the tested internal nodes must be probed at the surface of the passivation layer, result interpretation by means of capacitive voltage contrast is mandatory for this purpose.

In the present state of the art, photon induced photoemission is not appropriate for testing passivated chips so as to obtain results by means of capacitive voltage contrast, due to the lack of pulsed light sources, e.g., pulsed laser systems, both having photon energies which exceed the work function of the passivation layer and having repetition rates in the MHz range. Passivation layers usually are made of polyimide, which has a work function of about 7 eV, or of aluminum oxide, which has a work function of about 8 eV. Existing pulsed light source means with such high photon energies are pulsed lasers having low repetition rates of a few kHz which do not allow to perform dynamic testing of electronic activity in the integrated circuit because it is extremely difficult to synchronize such low repetition rates with chip signals related to clock rates in the MHz range. To enable such testing with currently available picosecond lasers having pulse repetition rates of up to 1 GHz, the work function of the passivation layer should not exceed about 2 eV. However, no material suitable for making a passivation layer is known to have such a low work function.

Electron beam testing of passivated chips delivers results by means of an analysis of capacitive voltage contrast and the detection of voltage changes by this method is well established, but the probing of static voltages is hindered by charging of the passivation layer. Also, this technique is unsuitable for integrated circuits of small dimensions operated in the MHz range (Simon C. J. Garth, "Electron beam testing of ultra large scale integrated circuits", Microelectronic Engineering 4 (1986) 121-138, cf. in particular pp. 131-132).

The following publications are representative of the prior art and scientific background:

U.S. Pat. No. 4,644,264 discloses a method for contactless testing of electronic activity in an integrated circuit chip-to-test after passivation thereof. The chip-to-test has a number of circuits and input/output connections and a plurality of test points connected to the circuits. It is passivated by means of a passivation layer which is covered by an overlayer. It is placed and supported in mounting means provided with electrical connections complementary to the input/output connections of the chip-to-test. The test points of the chip-to-test can be accessed by laser photons from a pulsed laser means. When the circuits on the chip-to-test are exercised to cause electronic activity therein, this provides at the test points, a voltage related to the circuit exercise. However, in this technique, the overlayer is used to collect photoelectrons tunneling through the passivation layer. Thus, the overlayer has to be conductive and a special control of the thickness of the passivation layer is required to ensure tunneling. This precludes currently manufactured normally passivated chips from being tested by this technique.

U.S. Pat. No. 4,703,260 discloses a method derived from that disclosed by U.S. Pat. No. 4,644,264 in that it is performed in vacuum and there are provided electron detector means for detecting electrons which pass through the passivation layer and the metallic overlayer and are emitted into the vacuum. However, this method is not capable of capacitive voltage contrast analysis because the conductive nature of the overlayer results in a smearing out of the spatial voltage contrast.

U.S. Pat. No. 4,706,018 discloses the principle of capacitive voltage contrast analysis performed in vacuum by means of laser photon induced photoemission on an integrated circuit chip-to-test devoid of passivation layer. The method so disclosed is not applicable to passivated chip-to-test for reasons already stated above, i.e., currently there is known no laser system delivering both sufficient photon energies and sufficient repetition rates.

SUMMARY OF THE INVENTION

It is a primary object of the present invention to provide a testing method which allows currently manufactured, normally passivated chips to be tested using photon induced photoemission so as to obtain results by means of capacitive voltage contrast analysis.

It is a further object of the present invention to provide a testing method which allows a passivated chip-to-test to be tested, the passivation layer of which is made of a dielectric material having a work function whose value exceeds the energy of said photons.

Still a further object of the present invention is to provide a testing method which allows a passivated chip-to-test to be tested, resulting in a capacitive voltage contrast representative of voltage differences between test points due to electronic activity in the passivated chip-to-test.

Still a further object of the present invention is to provide a testing method which allows a passivated chip-to-test to be tested, resulting in a capacitive voltage contrast representative of voltage variations at a selected test point due to electronic activity in the passivated chip-to-test.

Another object of the present invention is to provide a testing method which allows a passivated chip-to-test to be tested in such manner that charging-up of the passivation layer is prevented, enabling both dynamic testing and static testing to be performed.

Another object of the present invention is to provide a system for contactless testing of electronic activity in an integrated circuit chip-to-test after passivation thereof, which system delivers capacitive voltage contrast representative of voltage differences between test points due to electronic activity in the passivated chip-to-test, and which system is adapted to facilitate testing of a passivated chip-to-test, the passivation layer of which is made of a dielectric material having a work function whose value exceeds the energy of said photons, while charging-up of the passivation layer is prevented.

Another object of the present invention is to provide a system for contactless testing of electronic activity in an integrated circuit chip-to-test after passivation thereof, which system delivers capacitive voltage contrast representative of voltage variations at a selected test point due to electronic activity in the passivated chip-to-test, and which system is adapted to facilitate testing of a passivated chip-to-test, the passivation layer of which is made of a dielectric material having a work function whose value exceeds the energy of said photons, while charging-up of the passivation layer is prevented.

These objects can be attained by the method for contactless testing of electronic activity in an integrated circuit chip-to-test after passivation thereof defined in claim 1. Preferred embodiments of this method are defined in the method claims 2 to 7. A system for contactless testing of electronic activity in an integrated circuit chip-to-test after passivation thereof is defined in the apparatus claims 8 or 9.

An advantage of the present invention is that it allows to apply normal photoemissive testing to a passivated integrated circuit chip-to-test.

Another advantage of the present invention is that it enables photoemission testing with picosecond lasers of up to 1 GHz pulse repetition rates.

A further advantage of the present invention is that it extends all the advantages of photoemission testing of non-passivated integrated circuit chips to passivated ones.

Still another advantage of the present invention is that it allows the results of photoemission testing of passivated integrated circuit chips-to-test to be given in terms of capacitive voltage contrast.

A still further advantage of the present invention is that it allows the results of photoemission testing of passivated integrated circuit chips-to-test given in terms of capacitive voltage contrast to be obtained suitable for analysis in the dynamic mode as well as in the static mode.

The foregoing and other objects, features and advantages of the present invention will be apparent from the more particular description of the preferred embodiments of the invention, as illustrated in the accompanying drawings.

DESCRIPTION OF A PREFERRED EMBODIMENT OF THE INVENTION

Figure 1:
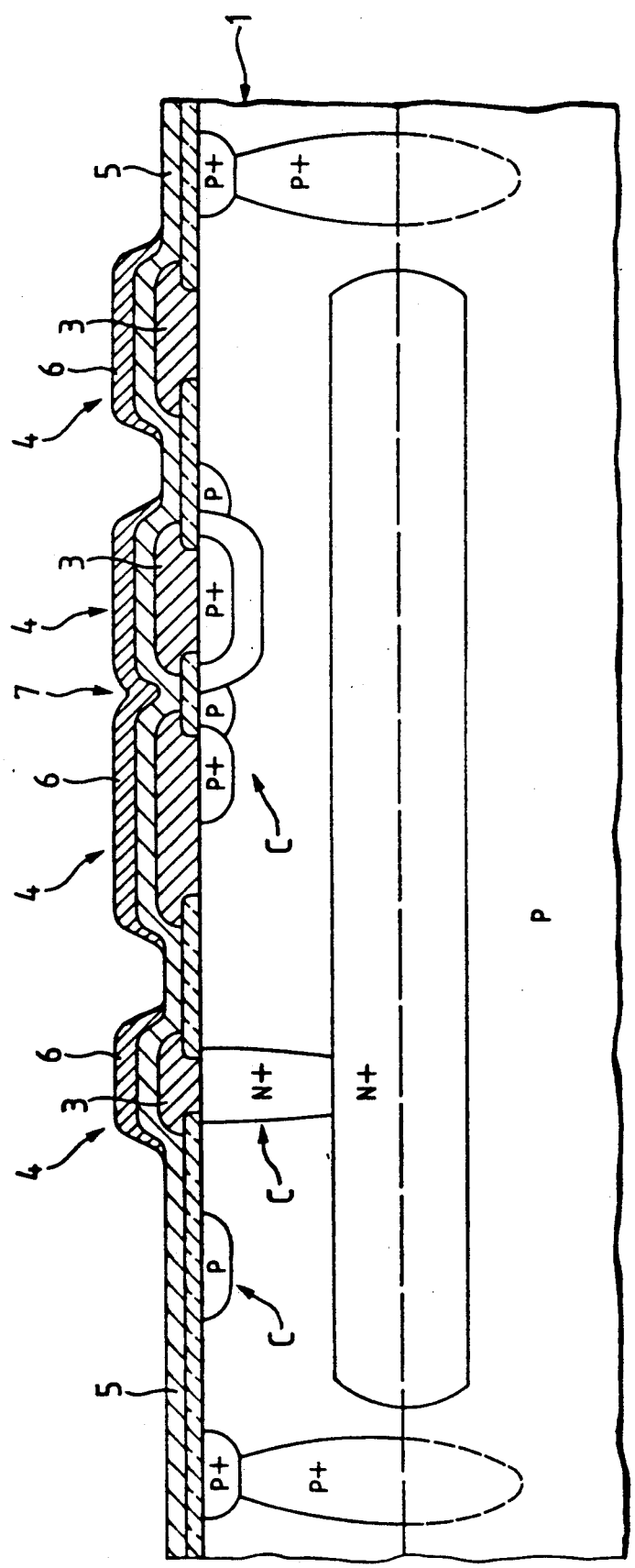
FIG. 1 is a schematic cross-sectional representation of a passivated integrated circuit chip-to-test having a passivation layer and an overlayer covering the passivation layer.

In FIG. 1 there is shown, in a schematic cross-sectional representation, a passivated integrated circuit chip-to-test 1 having a passivation layer and an overlayer partly covering the passivation layer.

Such a chip-to-test for instance is an integrated circuit chip in the final stage of its manufacture. It has complex semiconductor doping areas embedded in a silicon substrate covered with several layers of metallization interspersed with several layers of insulation and passivation, and should be submitted to final functional tests. For the sake of clarity, when the invention is explained and illustrated hereinafter, FIG. 1 shows a simplified representation of such a chip-to-test.

The chip-to-test 1 shown in FIG. 1 has a number of doped regions (P, P+, N+) forming electronic devices and circuits such as those designated with C and input/output connections such as those designated with 3, a plurality of test points such as those designated with 4 and which are connected to the circuits C, a passivation layer 5 and an overlayer 6 covering the passivation layer 5. The overlayer 6 is shown in FIG. 1 to cover the passivation layer 5 only at the test points 4, but it should be understood that in order to perform the method of the invention the passivation layer 5 may be covered by the overlayer 6 over the whole surface of the chip-to-test 1 substantially as shown at the location designated with 7. Also, the test points 4 are shown as conductive points or portions distinct from the circuits C and connected thereto, but it should be understood that the method of the invention can be performed using test points which immediately are points or portions of conductive links interconnecting the circuits C and/or input/output connections 3.

The passivation layer 5 is made of any material currently used to passivate integrated circuit chips. Examples of such materials are polyimide, which has a work function of about 7 eV, or aluminum oxide, which has a work function of about 8 eV.

According to the invention, the overlayer 6 is a thin insulating layer made of a dielectric material selected to have a work function, the value of which is lower than the energy of photons of currently available pulsed light source means, e.g., picosecond lasers, having pulse repetition rates of up to 1 GHz. In practice, the work function of the passivation layer should not exceed about 5 eV and preferably should be lower than 2 eV.

Accordingly, the material of the overlayer 6 preferably is selected from the group consisting of BeO, MgO, CaO, TiO2, SrO, Cs2O, BaO and mixtures thereof, of which the respective work functions approximately are 3.8 eV for BeO, 3.5 eV for MgO, 2.0 eV for CaO, 3.0 eV for TiO2, 1.4 eV for SrO, 1.1 eV for Cs2O and 1.2 eV for BaO. More preferably, the overlayer 6 is made of SrO, Cs2O, BaO or a mixture thereof.

The thickness of the overlayer 6 should be sufficient to substantially produce therein said value of the work function of its component material or mixture. Also, the thickness of the overlayer 6 should be sufficient to provide for continuity of coverage, i.e., the overlayer 6 should not show a system of patches and holes. In practice, the overlayer 6 should be thicker than about 5 atom layers. On the other hand, the upper thickness limit of the overlayer 6 should be that no appreciable mechanical stress is induced in the underlying passivation layer 5 nor, all the more, in the circuits C and input/output connections 3. In practice, the overlayer 6 should be thinner than about 0.5 μm. It will be appreciated that due to its material such an overlayer 6 is stable and not intended to be removed from the passivation layer 5 it covers.

To deposit the overlayer 6 upon the passivation layer 5, any known method can be used which is appropriate to deposit the above mentioned materials of the overlayer 6 on a passivation layer 5 of the kind currently used to passivate integrated circuit chips, e.g., made of the above mentioned materials. Examples of such deposition methods are vacuum evaporation, reactive evaporation in vacuum, sputtering, reactive sputtering and the like.

Figure 2:
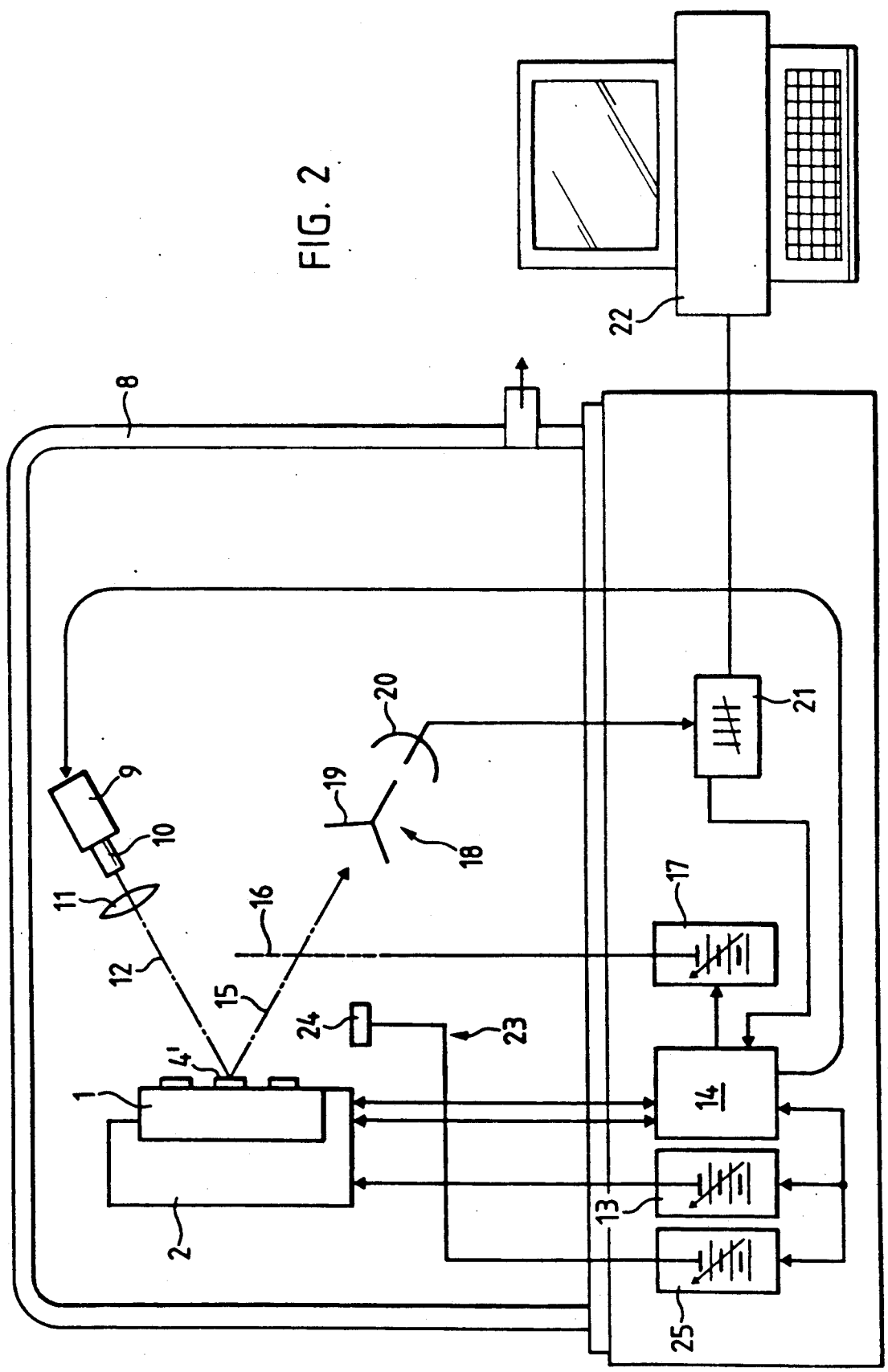
FIG. 2 is a schematic representation of a system for contactless testing of electronic activity in an integrated circuit chip-to-test after passivation thereof, which system constitutes a preferred embodiment of the invention.

In FIG. 2 there is shown, in a schematic representation, a preferred embodiment of a system for performing the method of the invention.

For the sake of clarity, the chip-to-test 1 is represented only schematically in FIG. 2 with but a selected one of its test points (referenced 4 in FIG. 1) being designated by reference numeral 4', while the passivation layer 5 and the overlayer 6 are not shown.

The entire operation is carried out in a vacuum chamber 8 which provides appropriate environment vacuum for the test system, for instance, a pressure of about 10-3 Pa (10-5 Torr) or lower.

The chip-to-test 1 is mounted within the vacuum chamber 8 in suitable mounting means 2 which provide electrical connections complementary to the input/output connections of the chip-to-test. As these electrical connections cannot be made clearly visible in the schematic representation of FIG. 2, they are not shown.

The mounting means 2 are adapted to support the chip-to-test 1 for accessibility by photons from a pulsed light source means 9 to the plurality of test points. The pulsed light source means 9 may be a pulsed laser means as in the embodiment described in the following. It should be understood, however, that the method of the invention can be performed using any other suitable pulsed light source means, e.g., a pulsed light emitting diode.

The pulsed laser means 9 is provided with a light modulation mechanism 10 and a focussing mechanism 11 which are operated to direct a light beam 12 to scan a sequence of test points on the chip-to-test 1. In the currently occurring scanning situation shown in FIG. 2, the light beam is focussed upon the selected test point 4' to a light spot. The maximum value of the light intensity is selected such that for one thing the light does not heat or affect the chip-to-test 1 or its passivation layer 5 or overlayer 6 in any appreciable manner. Furthermore, the maximum light intensity is selected such that no appreciable interaction will occur with any photoelectrons, the presence of which will be explained below. The light spot has a diameter (defined as the diameter of the area where the light intensity is more than half of its maximum value) as small as possible, for instance of 0.5 μm.

The pulsed laser means 9 is shown in FIG. 2 to be arranged within the vacuum chamber 8 in such manner that the photons emitted by the pulsed laser means 9 can access the chip-to-test 1. It should be understood, however, that the method of the invention can be performed using a pulsed light source means arranged outside the vacuum chamber 8 and whose photons penetrate into the vacuum chamber 8 through a suitably transparent and vacuum-tight window.

The chip-to-test 1 is supplied with suitable bias voltages from a bias source 13 and is further supplied with electrical signals from circuit exercise means 14 connected to the chip-to-test 1 via the electrical connections mentioned above.

The circuit exercise means 14 can be constituted or comprised of a computer and have the characteristics of a high speed logic testing system of any type now common in the art of testing an integrated circuit by exercising it under dynamic or static conditions simulating actual or stressed operation. To this effect, the circuit exercise means 14 are equipped to provide the chip-to-test 1 with appropriate dynamic or static operating signals to test the chip-to-test 1 for instance at the operating speed for which the circuit normally is run or under dynamically stressed conditions including high speed or off-specification voltages, currents or timings.

The bias source 13 is shown in FIG. 2 as a variable battery, in practice it may be a controlled supply of variable voltage which can provide operating bias voltage or an off-specification bias voltage to simulate stressed operation of the chip-to-test 1, for instance under the control of the circuit exercise means 14.

The circuit exercise means 14 thus can exercise the circuits on the chip-to-test 1 to cause electronic activity therein, appropriate to the desired test, causing respective voltages to appear at the selected test point 4' in relationship with the circuit exercise currently performed.

Once the chip-to-test 1 has been exercised to the point of operating temperature and to the point where a signal of known characteristics is expected at the selected test point 4', it is desired to determine whether the appropriate signal is present or not. For this purpose, the light beam 12 is focussed upon the selected test point 4' in such manner that at the selected test point 4' currently being illuminated, the emission of photoelectrons 15 is induced by the light pulse from the overlayer referenced 6 in FIG. 1. These photoelectrons 15 carry a characteristic distribution of electron energies which is modulated as a composite function of the instant electrical signal available in the integrated circuit chip-to-test 1 at the selected test point 4' and, of course, of the characteristics of the applied light.

The photoelectrons 15 reach detector bias means shown in FIG. 2 as a combination of a grid 16 and a bias source 17. If of appropriate characteristics, the photoelectrons 15 pass through the detector bias means and then reach electron detector means 18. Similar to the bias source 13, the bias source 17 is shown in FIG. 2 as a variable battery under the control of the circuit exercise means 14, but in practice it may take a variety of forms as long as the detector bias is appropriate to the electron detector means 18 and to the test being performed.

Thus, due to the detector bias means the electron detector means 18 are applied a certain predetermined retarding electric field which is effective as a detection threshold for the photoelectrons: only those photoelectrons having energies which exceed a certain predetermined discrimination level (for example, having energies above 1 eV for a 1 V retarding voltage difference between the electron detector means 18 and the selected test point 4') reach the electron detector means 18 and are analyzed therein in respect of their number and energy.

It is well known and has been disclosed, for example, in U.S. Pat. No. 4,706,018 that such electron counts in the electron counting circuit 21 constitute a signal representative of the voltage occurring at the currently scanned test point 4' of the chip-to-test 1 during the light pulse: when this voltage respectively becomes more or less positive relative to the grid 16, more or less photoelectrons are prevented from passing the grid 16 to be measured in the electron counting circuit 21.

Of course, the electron counts signal reflecting the voltage occurring at the currently scanned test point 4' is one of a sequence of signals corresponding to the scanned sequence of test points of the chip-to-test 1. This results in a distribution table or histogram of detected energy values being built up, representative of the sequence of voltages scanned at the passivated chip-to-test.

In one embodiment of the method of the invention, the pulsed laser means 9, the light modulation mechanism 10 and the focussing mechanism 11 are operated to scan a sequence of test points. The energy of the photoelectrons is then analyzed as a function of said sequence of test points.

In an alternative embodiment of the method of the invention, the pulsed laser means 9, the light modulation mechanism 10 and the focussing mechanism 11 are operated to scan the selected test point 4' at a sequence of scanning times. The energy of the photoelectrons is then analyzed as a function of said sequence of scanning times.

To convert the resulting sequence of signals into an information more vividly accessible to a person, means 22 are provided for deriving from this sequence of signals a representation of the corresponding sequence of voltages and thus of the electronic activity in the passivated chip-to-test 1. In FIG. 2, these means 22 are shown in the form of a computer adapted and programmed to map the sequence of voltage values onto a displayed schematic representation of the chip-to-test. Such mapping may be performed by means of a color or intensity contrast which visualizes the voltage contrast. The voltages having been sensed contactless, i.e. capacitively, the resulting visualization generally is called a capacitive voltage contrast.

When a sequence of test points is scanned and the energy of the photoelectrons is analyzed as a function of the sequence of test points, the capacitive voltage contrast derived therefrom is representative of voltage differences between said test points due to electronic activity in the passivated chip-to-test. When one selected test point is scanned at a sequence of scanning times and the energy of the photoelectrons is analyzed as a function of the sequence of scanning times, the capacitive voltage contrast derived therefrom is representative of voltage variations at the selected test point in the course of time, due to electronic activity in the passivated chip-to-test. In both cases it is implied that the scanning period is very short in comparison to the period or time constant for the variation of the electrical signals in the chip-to-test.

It should, of course, be understood that the method of the invention can be performed using any kind of representation or visualization and the apparatus of the invention can be comprised of any appropriate representation or visualization means.

The light pulse can be sufficiently fast (for instance having a duration of a few picoseconds or less) to resolve the AC switching transient accompanying a change in logic state at the currently scanned test point 4' as well as the logic state itself.

By way of example, the electron detector means 18 include a detector 19, which, for instance, is a channel electron multiplier. The detector 19 supplies electrons via an electron collector 20, which for instance, is simply a piece of stainless steel sheet formed into a dish, to an electron counting circuit 21, which for instance is a pulse discrimination counter. The channel electron multiplier, electron collector 20 and electron counting circuit 21 together form the electron detector means 18. Electron detector means of this type are known from U.S. Pat. No. 4,706,018 and any useful construction details thereof as well as other possible embodiments of the bias and detector systems are disclosed therein and incorporated by reference in this disclosure.

If desired, the signal or electron counts of the electron counting circuit 21 can be fed back to the circuit exercise means 14 for comparison against appropriate test standards and determination of test results for use in further testing acceptance or rejection of the chip-to-test 1 as a satisfactory acceptable integrated circuit chip.

In the apparatus as described above, the probing of static (or slowly varying) voltages in the chip-to-test would be hindered by charging of the passivation layer and overlayer. To provide a testing method which allows a passivated chip-to-test to be tested in such manner that charging-up of the passivation layer and overlayer is prevented, enabling both dynamic testing and static testing to be performed, flooding means 23 are provided for flooding the chip-to-test 1 with a cloud of electrons whose energy is lower than the predetermined discrimination level or detection threshold of the electron detector means 18.

Such flooding means 23 comprise an electron flood gun 24 operating as a uniform wide angle source of low energy electrons (electrons having energies e.g., much lower than 0.3 eV) and supplied with a suitable bias voltage in respect of the chip-to-test 1 from a bias source 25. As such flooding means 23 are commercially available and their use has been described {C. E. Bryson, "Surface Potential Control in XPS", Surface Science 189/190 (1987) 50–58}, the representation thereof in FIG. 2 is schematic and does not show details of the electron flood gun 24 nor ancillary equipment such as power supply means for cathode heating and similar. The bias source 25 is shown in FIG. 2 as a variable battery under the control of the circuit exercise means 14, similar to the bias sources 13 and 17, but in practice, it also may take a variety of forms as long as the flooding bias is controlled to be lower than the predetermined discrimination level or detection threshold of the electron detector means 18. The maximum flooding intensity is selected, depending on the maximum intensity of the light, sufficient to prevent charging-up of the passivation layer and overlayer (cf. C. E. Bryson quoted above).

As soon as charging-up of the passivation layer or overlayer occurs, due to the emission of photoelectrons, the charged-up layer becomes more positive and attracts electrons out of the surrounding low-energy electron cloud provided by the flooding, so that any charging-up is effectively compensated and kept negligible. This provision makes it unnecessary to periodically discharge the charged-up layer by means of the exercise applied to the chip-to-test and thus allows to extend the method of the invention to a static or quasi-static testing procedure with constant or slowly varying voltages applied to the chip-to-test.

The low-energy flooding electrons do not disturb the capacitive voltage contrast, as the latter is derived only from those photoelectrons whose energy is higher than the predetermined discrimination level or detection threshold of the electron detector means 18, while the energy of the flooding electrons is lower than this predetermined discrimination level or detection threshold. Preferably, this discrimination level or detection threshold is set at about half the maximum kinetic energy of the photoelectrons, which energy is substantially equal to the difference between the photon energy and the work function of the overlayer. Using Cs2O as the material of the overlayer, so that the work function of the overlayer is approximately 1.1 eV, and using as the pulsed light source means a currently available picosecond laser having suitable pulse repetition rates and photon energies of more than 2 eV, the resulting spread of the kinetic energy of the electrons is at least about 0.9 eV. Thus, the discrimination level or detection threshold preferably is set at about 0.5 eV.

Picosecond lasers suitable as indicated above are e.g., Nd:YAG (semiconductor) lasers which provide a photon energy of about 4.66 eV after frequency quadrupling of the original laser output at a photon energy of about 1.165 eV, or dye lasers pumped by ion lasers which are currently available with pulse repetition rates up to 1 GHz according to the respective laser manufacturers.

Another kind of light source means suitable as indicated above are laser diodes which currently provide a photon energy of about 2 eV with pulse repetition rates of a few GHz. The photon energy of such laser diodes is sufficient when used in combination with BaO, SrO and Cs2O, of which the respective work functions approximately are 1.2 eV for BaO, 1.4 eV for SrO and 1.1 eV for Cs2O.

Still another kind of light source means suitable as indicated above are light emitting diodes which generally offer properties similar to those of laser diodes except for the lower light intensity.

To perform the method of the invention, the operator selects the material of the overlayer 6 and provides the chip-to-test 1 with this overlayer 6 as has been explaines hereinbefore. After that, the operator places the chip-to-test 1 in the mounting means 2 so that the circuit exercise means 14 are connected thereto. Then, vacuum environment is provided and the circuit exercise means 14 are exercised to cause electronic activity in the chip-to-test 1. The pulsed light source means 9 is operated so as to induce electron photoemission from the overlayer 6 at the selected test point 4', and the energy of the photoelectrons is detected in the electron detector means 18. In this manner, a passivated chip-to-test can be tested, the passivation layer of which is made of a dielectric material having a work function whose value exceeds the energy of the photons. The pulsed light source means 9 may be operated to scan a sequence of test points or to scan one selected test point 4' at a sequence of scanning times. Preferably, the energy discrimination level of the electron detector means 18 is set as has been explained hereinbefore, and the chip-to-test is flooded with a cloud of low-energy electrons so as to prevent charging-up of the passivation layer and overlayer, as has been explained hereinbefore.

Thus, while the invention has been described with reference to a preferred embodiment and the variations of its mode of operation, it will be understood by those skilled in the art that the foregoing and other changes in form and details may be made without departing from the scope of the invention defined in the appended claims.

Having thus described our invention, what we claim as new and desire to secure by Letters Patent is:

1. A method for contactless testing of electronic activity in an integrated circuit chip-to-test after passivation thereof, said chip-to-test having a number of circuits and input/output connections, a plurality of test points connected to the circuits and a passivation layer, said method comprising the steps of placing the chip-to-test (1) in mounting means (2) provided with electrical connections adapted to support the chip-to-test in a vacuum environment (8) for accessibility by photons (12) from a pulsed light source means (9) to the plurality of test points (4), one of which is designated as a selected test point (4'), covering at least at the test points said passivation layer (5) with an overlayer (6), the material of which is selected to be a dielectric non-electrically conductive material having a work function whose value is lower than the energy of said photons (12), connecting circuit exercise means (14) to the chip-to-test (1) via said electrical connections so as to exercise the circuits (C) on the chip-to-test to cause electronic activity therein, appropriate to the desired test, so as to provide at the test points (4) a respective voltage related to the circuit exercise, operating the pulsed light source means (9) so as to induce electron photoemission (15) from the overlayer (6) at the selected test point (4'), whereby the energy of the resulting photoelectrons is a function of the voltage at the selected test point, and detecting (18) the energy of the photoelectrons (15) to result in detected energy values (21) representative of the voltage at the selected test point (4') of the passivated chip-to-test (1), whereby a passivated chip-to-test can be tested, the passivation layer of which is made of a dielectric material having a work function whose value exceeds the energy of said photons.

2. The method of claim 1, in which the pulsed light source means (9) is operated to scan a sequence of test points (4) and the energy of the photoelectrons (15) is analyzed (21) as a function of said sequence of test points to derive therefrom (22) a capacitive voltage contrast representative of voltage differences between said test points due to electronic activity in the passivated chip-to-test (1).

3. The method of claim 1, in which the pulsed light source means (9) is operated to scan the selected test point (4') at a sequence of scanning times and said energy of the photoelectrons (15) is analyzed (21) as a function of said sequence of scanning times to derive therefrom (22) a capacitive voltage contrast representative of voltage variations at said selected test point due to electronic activity in the passivated chip-to-test (1).

4. The method according to any of claims 1 to 3, in which the overlayer (6) is deposited to cover the passivation layer (5) at least at the test points (4) with a thin insulating layer up to a thickness sufficient to provide for continuity of coverage and to substantially produce in the overlayer said value of the work function.

5. The method according to any of claims 1 to 4, in which the material of the overlayer (6) is selected from the group consisting of BeO, MgO, CaO, TiO2, SrO, Cs2O, BaO and mixtures thereof.

6. The method of claim 5, in which the material of the overlayer (6) is selected from the group consisting of SrO, Cs2O, BaO or a mixture thereof.

7. The method according to any of claims 2 to 6, further characterized in that an energy discrimination level is set (16) at a value about equal to half the difference between the energy of the photons (12) and the work function of the material of the overlayer (6), and that during operation of the pulsed light source means (9) the chip-to-test (1) is flooded (24) with a cloud of electrons whose energy is lower than the discrimination level while only those photoelectrons (15) are detected whose energy exceeds the discrimination level, whereby charging-up of the passivation layer (5) and of the overlayer (6) is prevented while capacitive voltage contrast is not weakened substantially.

8. A system for contactless testing of electronic activity in an integrated circuit chip-to-test after passivation thereof, said chip-to-test having a number of circuits and input/output connections, a plurality of test points connected to the circuits, a passivation layer and a dielectric overlayer covering the passivation layer at least at the test points, said system comprising:
- a vacuum chamber (8),
- mounting means (2) arranged within said vacuum chamber for mounting a passivated chip-to-test (1), provided with electrical connections complementary to the input/output connections (3) of the chip-to-test and adapted to support the chip-to-test for accessibility by photons (12) to the plurality of test points (4) of the chip-to-test,
- a pulsed light source means (9) for emitting said photons (12), adapted to cause said photons to access the chip-to-test (1) and operable to scan a sequence of test points (4) to induce electron photoemission (15) from said dielectric overlayer (6) at a currently scanned test point (4'),
- flooding means (24) for flooding the chip-to-test (1) with a cloud of electrons whose energy is lower than a predetermined discrimination level,
- circuit exercise means (14) connected to the chip-to-test (1) via said complementary connections for exercising the circuits (C) on the chip-to-test to cause electronic activity therein, appropriate to the desired test, so as to provide at the test points (4) a respective voltage related to the circuit exercise,
- electron detector means (18) provided with a detection threshold (16) set at about said discrimination level for detecting photoelectrons (15) resulting from said induced electron photoemission and having an energy which exceeds the discrimination level, and for delivering a signal representative of the voltage occurring at the currently scanned test point (4'), which signal is one of a sequence of said signals corresponding to the scanned sequence of test points,
- means (21) for analyzing said sequence of signals as a function of said sequence of test points, and
- means (22) for deriving from said sequence of signals a capacitive voltage contrast representative of the electronic activity in the chip-to-test (1), thereby to facilitate testing of a passivated chip-to-test, the passivation layer of which is made of a dielectric material having a work function whose value exceeds the energy of said photons, while charging-up of the passivation layer is prevented and capacitive voltage contrast is not weakened substantially.

9. A system for contactless testing of electronic activity in an integrated circuit chip-to-test after passivation thereof, said chip-to-test having a number of circuits and input/output connections, a plurality of test points connected to the circuits, a passivation layer and a dielectric overlayer covering the passivation layer at least at the test points, said system comprising:
- a vacuum chamber (8),
- mounting means (2) arranged within said vacuum chamber for mounting a passivated chip-to-test (1), provided with electrical connections complementary to the input/output connections (3) of the chip-to-test and adapted to support the chip-to-test for accessibility by photons (12) to the plurality of test points (4) of the chip-to-test, one of which is designated as a selected test point (4'),
- a pulsed light source means (9) for emitting said photons (12), adapted to cause said photons to access the chip-to-test (1) and operable to scan the selected test point (4') at a sequence of scanning times to induce electron photoemission (15) from said dielectric overlayer (6) at the selected test point,
- flooding means (24) for flooding the chip-to-test (1) with a cloud of electrons whose energy is lower than a predetermined discrimination level,
- circuit exercise means (14) connected to the chip-to-test (1) via said complementary connections for exercising the circuits (C) on the chip-to-test to cause electronic activity therein, appropriate to the desired test, so as to provide at the selected test point (4') a sequence of voltages related to the circuit exercise,
- electron detector means (18) provided with a detection threshold (16) set at about said discrimination level for detecting photoelectrons (15) resulting from said induced electron photoemission and having an energy which exceeds the discrimination level, and for delivering a signal representative of the voltage occurring at the selected test point (4') at the respective scanning time, which signal is one of a sequence of said signals corresponding to said sequence of scanning times,
- means (21) for analyzing said sequence of signals as a function of said sequence of scanning times, and
- means (22) for deriving from said sequence of signals a capacitive voltage contrast representative of the electronic activity in the chip-to-test (1), thereby to facilitate testing of a passivated chip-to-test, the passivation layer of which is made of a dielectric material having a work function whose value exceeds the energy of said photons, while charging-up of the passivation layer is prevented and capacitive voltage contrast is not weakened substantially.

* * * * *